(12) United States Patent
Schroder et al.

(10) Patent No.: US 6,777,639 B2
(45) Date of Patent: Aug. 17, 2004

(54) RADIAL PULSED ARC DISCHARGE GUN FOR SYNTHESIZING NANOPOWDERS

(75) Inventors: Kurt A. Schroder, Coupland, TX (US); Doug K. Jackson, Austin, TX (US)

(73) Assignee: Nanotechnologies, Inc., Austin, TX (US)

( * ) Notice: Subject to any disclaimer, the term of this patent is extended or adjusted under 35 U.S.C. 154(b) by 0 days.

(21) Appl. No.: 10/455,292

(22) Filed: Jun. 5, 2003

(65) Prior Publication Data

US 2003/0230554 A1 Dec. 18, 2003

Related U.S. Application Data

(60) Provisional application No. 60/388,200, filed on Jun. 12, 2002.

(51) Int. Cl.[7] .............................................. B23K 10/00
(52) U.S. Cl. ............................ 219/121.59; 219/121.47; 219/121.52
(58) Field of Search ....................... 219/121.59, 121.47, 219/121.36, 121.43, 121.52, 121.48, 121.37, 121.5, 121.41; 427/446, 233, 450, 576; 204/298.03, 298.07, 164; 423/325, 345, 246; 75/228, 230, 232, 334, 333

(56) References Cited

U.S. PATENT DOCUMENTS

| | | | |
|---|---|---|---|
| 3,829,538 A | * | 8/1974 | Darmara et al. ............... 75/333 |
| 4,374,075 A | * | 2/1983 | Yolton et al. .................. 264/8 |
| 4,610,718 A | | 9/1986 | Araya |
| 4,886,547 A | | 12/1989 | Mizukami |
| 5,514,349 A | | 5/1996 | Parker |
| 5,560,960 A | | 10/1996 | Singh |
| 5,581,507 A | | 12/1996 | Scherpenberg |
| 5,874,684 A | | 2/1999 | Parker |
| 6,126,740 A | | 10/2000 | Schulz |
| 6,190,634 B1 | | 2/2001 | Lieber |
| 6,217,901 B1 | | 4/2001 | Perrott |
| 6,472,374 B1 | | 10/2002 | Charnock-Jones |
| 6,472,632 B1 | | 10/2002 | Peterson |
| 6,479,028 B1 | | 11/2002 | Kaner |
| 6,600,127 B1 | | 7/2003 | Peterson |
| 2003/0108459 A1 | | 6/2003 | Wu |

OTHER PUBLICATIONS

Weihua Jiang and Kiyoshi Yatsui, "Pulsed Wire Discharge for Nanosize Powder Synthesis", IEEE Transactions On Plasma Science, Oct. 1998, pp. 1498–1501, vol. 26, No. 5, IEEE, United States.

A. Weisenburger, " Application of Pulsed Power and Microwave Techniques for the Production of Nano–crystalline Powders and Ceramic Bulk Materials", Published in Metastable, Mechanically Alloyed and Nanocrystalline Materials, year 2000, pp 545–550, Materials Science Forum, vols. 343–346, Trans Tech Publishers Ltd., Switzerland.

* cited by examiner

Primary Examiner—Quang T. Van
(74) Attorney, Agent, or Firm—Gerald E. Lester; Ross Spencer Garsson Winstead Sechrest & Minick P.C.

(57) ABSTRACT

A system and method for synthesizing nanopowder which provides for precursor material ablation from two opposing electrodes that are substantially axially aligned and spaced apart within a gaseous atmosphere, where a plasma is created by a high power pulsed electrical discharge between the electrodes, such pulse being of short duration to inertially confine the plasma, thereby creating a high temperature and high density plasma having high quench and/or reaction rates with the gaseous atmosphere for improved nanopowder synthesis.

45 Claims, 2 Drawing Sheets

RADIAL PULSED ARC DISCHARGE GUN FOR SYNTHESIZING NANOPOWDERS

PRIORITY DATE CLAIM

This patent application claims the benefit of the earlier filing date of the U.S. Provisional Patent Application Ser. No. 60/388,200, which was filed on Jun. 12, 2002, with named inventors Kurt Schroder and Doug Jackson, and which is assigned to the assignee of the present invention.

BACKGROUND OF THE INVENTION

Systems for producing nanopowders are known which ionize an inert gas to create a plasma in a reactor vessel that vaporizes a precursor material. A quench and/or reaction gas is injected into the vaporized precursor material to produce nanopowders having a desired composition. U.S. Pat. No. 5,514,349 discloses a transferred arc system similar to a tungsten inert gas (TIG) welder, wherein a single rod of metal precursor material acts as an anode, and is vaporized by feeding the anode past a nonconsummable tungsten cathode to expose the anode to a discharge arc. A gas in then injected into the vaporized material to quench and form the nanopowder. The transferred arc system is designed to avoid erosion of the tungsten electrode.

U.S. Pat. No. 6,472,632 discloses another method to produce nanopowders which uses a prior art axial electrothermal gun, as illustrated in FIG. 1. The axial electrothermal gun or axial gun 10 is shown with a breech electrode 11, an annular muzzle electrode 12, and a barrel 13 having a hollow bore 14. The breech electrode 11 fits into and pneumatically seals one end of the hollow bore 14. The muzzle electrode 12 is attached to and substantially axially aligned with the barrel 13. The breech electrode 11 further is connected by way of a conducting wire 15 to the negative terminal of a high-power, pulsed discharge power supply 16, the positive terminal of which is connected by way of a conducting wire 17 to the muzzle electrode 12. Unlike the transferred arc system, the polarity of the electrodes in the axial gun 10 is not important, and the device can be operated with the polarity reversed. This axial gun embodiment has been successful in producing moderate volumes of nanopowder in the 10–100 nanometer range.

In operation, the power supply 16 is energized to create an electric field between the breech electrode 11 and the muzzle electrode 12, and thereby discharge a high power pulsed arc 18 between the electrodes. The discharge of the pulsed arc 18 ablates the muzzle electrode 12, which is the primary source for plasma. More particularly, the material removal rate from the muzzle electrode 12 is a factor of 10–100 greater than the material removal rate from the breech electrode 11.

The pulsed arc discharge in the axial gun 10 occurs in an interval of time too short to allow the plasma to fully expand and equilibrate in the surrounding atmosphere (inertial confinement), and in an area physically confined by the walls of the bore 14 (physical confinement). The combined confinement creates a high temperature (~50,000° K), high density (~$10^{20}/cm^3$) plasma which is not ordinarily obtainable in other plasma based systems such as those disclosed by U.S. Pat. Nos. 5,514,349; 5,874,684; and 5,851,507. The plasma acts to ablate the muzzle electrode 12 by means of the rapidly exiting high-temperature plasma. The plasma together with the ablated material exits the muzzle 12 under high pressure (~15,000PSI) and supersonic velocity. The ablated material thereafter may be quenched by and/or reacted with a surrounding gas such as one or more of air, oxygen, nitrogen, or helium to produce a cloud of nanopowder.

Referring to FIG. 2, a prior art transferred-arc-discharge process is illustrated in which a tungsten electrode 20 is shielded in a flow of pure inert gas 21 such as Argon, and is principally aligned with a rod 22 of precursor material. The inert gas shield protects the tungsten electrode 20 from erosion and oxidation. The inert gas ionizes to sustain the arc, but does not act to quench or react with material removed from rod 22.

Rod 22 is connected by way of a conducting wire 23 to the positive terminal of a DC power supply 24, the negative terminal of which is connected by way of a conducting wire 25 to the tungsten electrode 20. The tungsten electrode 20 is charged negatively with respect to the rod 22 to retard the absorption of heat and rate of erosion of the tungsten electrode. With these polarities, the material removal rate from the rod 22 is a factor of 100–1000 times greater than that of the tungsten electrode 20.

In operation, the DC power supply 24 is energized to effect a continuous DC low power arc discharge between the tungsten electrode 20 and the rod 22. The arc discharge erodes rather than ablates the rod 22. The material so produced is conveyed away from the vicinity of the arc discharge by the flow of the pure inert gas 21, and injected with a quench and/or reaction gas(es) 21, such as argon, helium and oxygen, to form the nanopowder.

From the above, it should be readily apparent that material removal in the operation of a transferred arc process, or an axial gun process is primarily from a single electrode.

BRIEF DESCRIPTION OF THE DRAWINGS

While the novel aspects and features of the invention are defined in the appended claims, the principles of the invention, illustrative embodiments, and preferred modes of use are best understood by reference to the Description Of Preferred Embodiments in conjunction with the following drawings, in which:

DETAILED DESCRIPTION OF PREFERRED EMBODIMENTS

The following terms shall have the definitions given below when used in either lower case or with capitalizations in this specification:

"Ablation" shall mean the removal of material from a body of precursor material due to the combined effects of heat transfer and mechanical shear caused by high fluid velocities.

"Erosion" shall mean the removal of material from a body of precursor material through localized heat transfer, as occurs when an electrical discharge arc attaches to a surface.

"Axial Gun" shall mean a pulsed power electrothermal gun, wherein a breech electrode and a muzzle electrode are composed of a precursor material, and are separated by a barrel with a bore.

"Radial Gun" shall mean a pulsed power electrothermal gun wherein two opposing electrodes of the gun are composed of a precursor material which is to be ablated, and the electrodes are substantially axially aligned opposite to each other within a gaseous atmosphere. The term "radial gun" is used for convenience only, and is not meant to imply any limitation of the present invention.

"Nanopowder" shall mean nanomaterial primarily comprised of nanoparticles which are of a size of 1–500 nanometers (nm).

Figure 1:
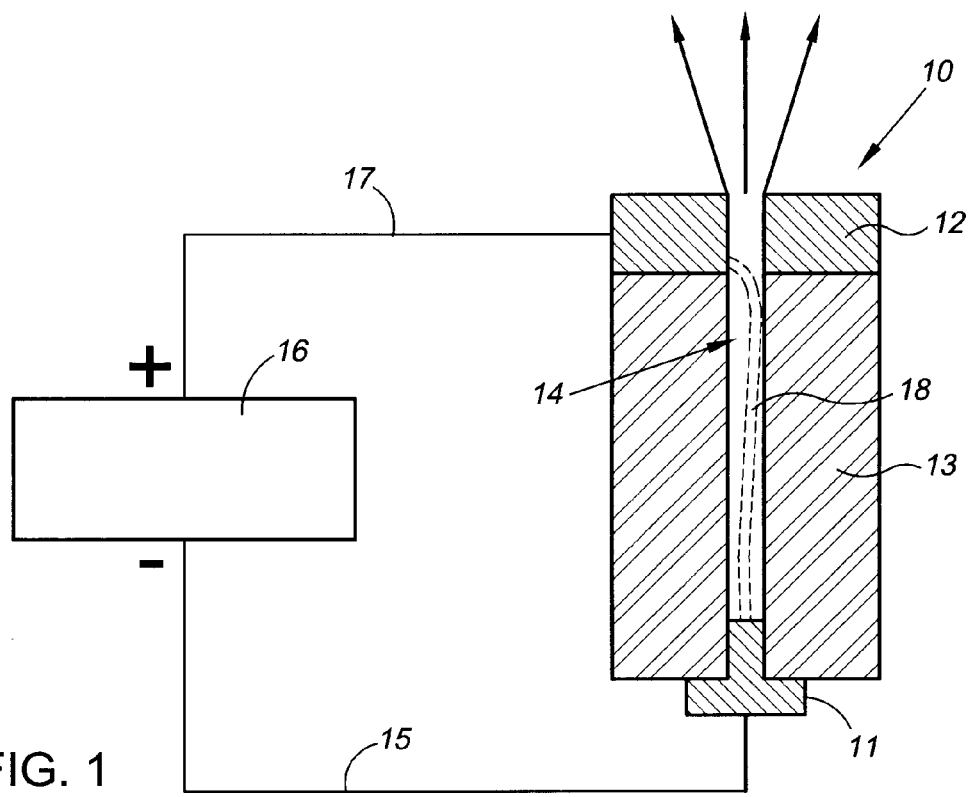
FIG. 1 is a graphic diagram of an axial electrothermal gun in the prior art, which is comprised of a breech electrode, a muzzle electrode, and a hollow bore.
Figure 2:
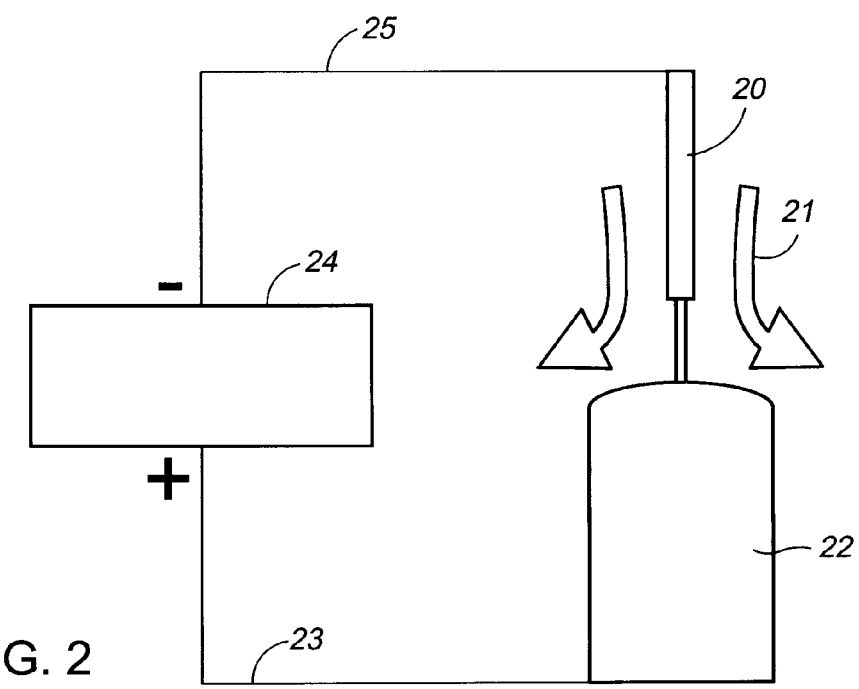
FIG. 2 is a graphic diagram of a transferred-arc-discharge process in the prior art, which is comprised of a tungsten electrode that is charged negative with respect to an anode electrode composed of precursor material.
Figure 3:
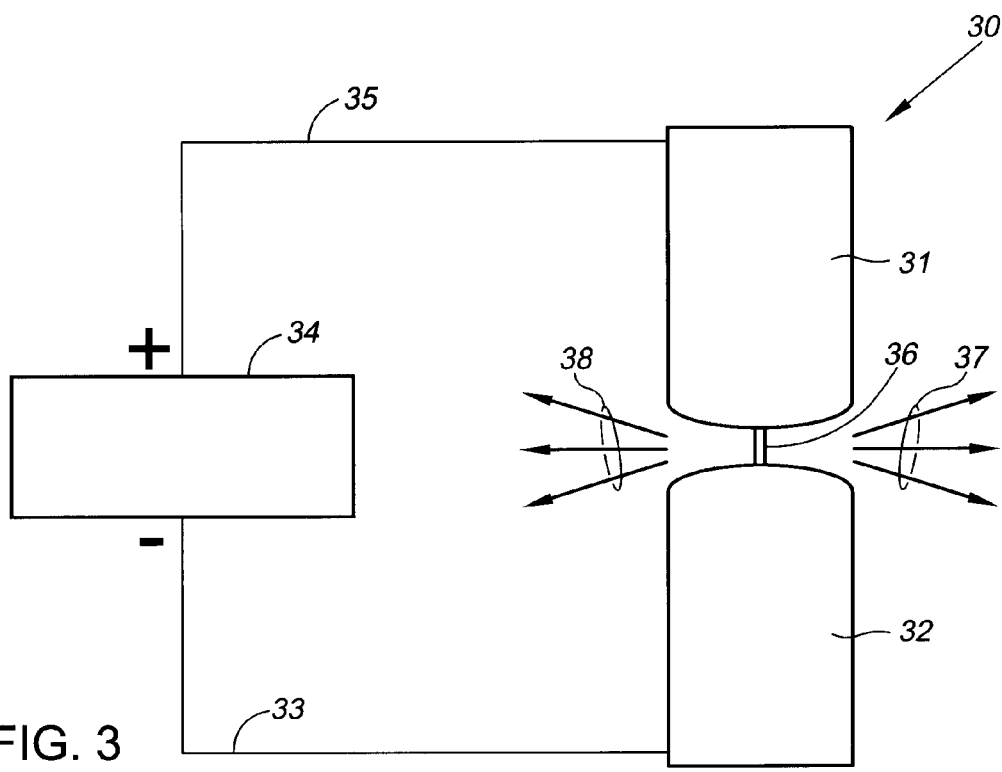
FIG. 3 is a graphic diagram of a radial electrothermal gun in accordance with the present invention, wherein an anode and a cathode of the gun are each composed of a precursor material, and are substantially axially aligned but spaced apart opposite to each other.

Referring to FIG. 3, a radial gun 30 in accordance with the present invention is illustrated, wherein an anode electrode 31 and a cathode electrode 32 (each formed of a precursor material and of uniform cross section) are spaced apart opposite to each other, and substantially axially aligned for maximal production of nanopowders. The electrode composition is typically the metal of the nanopowder being produced, such as but not limited to aluminum, tantalum, titanium, or zirconium. The nanopowder itself may be, but is not limited to, a metal such as aluminum or copper; an oxide such as $Al_2O_3$ or $TiO_2$; a nitride such TiN, ZrN, or $Ta_2N$; or other metals and metal compounds. Please refer to the article, "Pulsed Wire Discharge for Nanosize Powder Synthesis", by Weihua Jiang and Kiyoshi Yatsui, IEEE Transactions On Plasma Science, vol. 26, No. 5, pp. 1498–1501 (October 1998).

The cathode electrode 32 is connected by way of a conducting wire 33 to the negative terminal of a pulsed power supply 34, the positive terminal of which is connected by way of a conducting wire 35 to the anode electrode 31. The pulsed power supply 34 may be of any of plural well known designs (which may vary depending upon the material and material size being produced) that are offered by and ordered from any of numerous well known manufacturers. Except for the pulsed power supply 34, the radial gun 30 may but need not be contained within a chamber or reactor vessel such as that disclosed in U.S. Pat. No. 5,514,349. The reactor vessel is filled with inert and/or reactive gases including but not limited to Argon, Nitrogen, Oxygen, or a combination thereof. The selection of the gaseous atmosphere is based upon the nanopowder that is desired, and the effect of the gas is to control the expansion and quench rate of the plasma that is created by a high-power pulsed electrical discharge between the anode electrode 31 and the cathode electrode 32.

In operation, the pulsed power supply 34 is energized to effect a high-power pulsed electrical discharge 36 between the cathode electrode 32 and anode electrode 31. For the current invention, the connection to the electrodes could easily be reversed in polarity without impacting the process. The energy from the discharge melts, vaporizes and ionizes material from the two electrodes to create a high temperature (of the order of 50,000° K), high density metal plasma which continues to sustain the electrical discharge from the pulsed power supply. The combined physical axial confinement provided by the electrodes and the inertial confinement resulting from the short term pulse of the electrical discharge, act to increase the temperature and density of the plasma to heights not ordinarily obtainable by other nanopowder synthesizing processes or apparatus. Since the electrodes impede axial expansion of the plasma, expansion occurs primarily radially as indicated by arrows 37 and 38 of FIG. 3. As the plasma expands, additional material is ablated from the electrodes. This additional material also contributes to the overall plasma and helps sustain the electrical discharge between the electrodes. The expanding plasma is forced out of the confines of the radial gun at supersonic speeds. It subsequently undergoes expansion, mixes with the chamber gases, and quenches at a rate of the order of $10^{6°}$ K/sec to form nanopowder. Depending on the ambient gas, the plasma may also react with the gaseous atmosphere to form compounds as it is being quenched.

After each high power electrical discharge, the pulsed power supply 34 is reenergized. Further, after nanopowder is produced from one or more high power, pulsed electrical discharges between the electrodes, the anode electrode 31 and the cathode electrode 32 are indexed toward each other only as required to maintain the production rate. The gas surrounding the electrodes is replenished as necessary to sustain the atmosphere within the reactor vessel.

It is to be understood that the above process may occur without the benefit of a reactor vessel or chamber, as the plasma created by the present invention need only be quenched by or reacted with a surrounding gaseous atmosphere to produce a desired nanopowder.

TABLE I

| SYNTHESIZING DEVICE | ELECTRODE | PRIMARY MATERIAL REMOVAL MECHANISM | RELATIVE AMOUNTS OF MATERIAL REMOVED |
|---|---|---|---|
| Transferred Arc | Tungsten | Arc Erosion (Minimized) | 1 |
|  | FeedStock | Arc Erosion | 100–1000 |
| Axial Gun | Breech | Arc Erosion | 1 |
|  | Muzzle | Ablation | 10–100 |
| Radial Gun | Electrode 1 | Ablation | ~1 |
|  | Electrode 2 | Ablation | ~1 |

In Table 1 above, relative removal rates between electrodes of a same nanopowder synthesis device are shown. Table 1 is not intended to show comparisons between synthesis devices.

Referring to Table I, it is seen that the two electrodes of the radial gun each serve almost equally as sources of ablative material. By way of contradistinction, both the axial gun and the transferred arc synthesizing devices have only one electrode that contributes to any substantial degree to the production of nanopowder.

Readily apparent differences between the transferred-arc processes and the radial gun are: (1) polarity reversal is of little to no effect in the radial gun, because the electrode material removal caused by erosion is negligible compared to the material removal from ablation; (2) material removal with a radial gun occurs at two electrodes rather than a single electrode; (3) no inert gas shielding is required by the radial gun to protect against electrode erosion; and (4) the power supply of the radial gun is pulsed rather than continuous.

The radial electrothermal gun also provides the following additional advantages over the transferred-arc processes for synthesizing nanopowder:

i. Increased quench rate of $10^6$–$10^8$ degrees Kelvin/sec. with the radial electrothermal gun (as compared to $10^4$ degrees Kelvin/sec. with the forced convection quenching used with the transferred arc processes) allows smaller sized nanopowder to be synthesized in higher aerosol densities;

ii. More uniform time-temperature nanoparticle synthesis, i.e. nucleation and growth, histories are provided with a radial gun which result in more uniform nanoparticle sizes;

iii. The increased plasma temperature occurring in a radial gun allows the synthesis of nanopowder from material having very high melting and boiling points;

iv. Less energy is used to produce greater quantities of nanopowder because the short duration of the pulsed discharge does not allow sufficient time for thermal diffusion. Consequently, there are fewer thermal (energy) losses to the surrounding environment; and v. Lower agglomeration of nanopowder occurs with the radial gun.

vi. Since both the cathode and the anode of the radial gun are made out of the precursor or ablative material, no contamination is introduced from the electrodes. Inherent to the transferred arc process is the contamination that comes from the tungsten electrode.

The radial electrothermal gun provides advantages including the following over the axial electrothermal gun in synthesizing nanopowder:

i. No high pressure seals are needed since the only physical confinement comes from the electrodes;

ii. No insulating bore is required. Thus, a source of both major cost, and impurities in the production of nanopowder is removed;

iii. The electrodes can be large diameter rods requiring almost no machining, thus further reducing cost; and iv. The electrodes are nearly all consumed.

A further comparison among the radial gun of the present invention, and prior art axial guns and transferred arc processes appears, in Table II below.

decreased, and less energy may be added to the arc discharge for a given arc current. The resulting plasma may be at a lower temperature and/or lower density than otherwise could be achieved, production rates are decreased, and the material produced is of a non-uniform quality. A solution to this problem is provided by the radial gun embodiment of FIG. 4.

Figure 4:
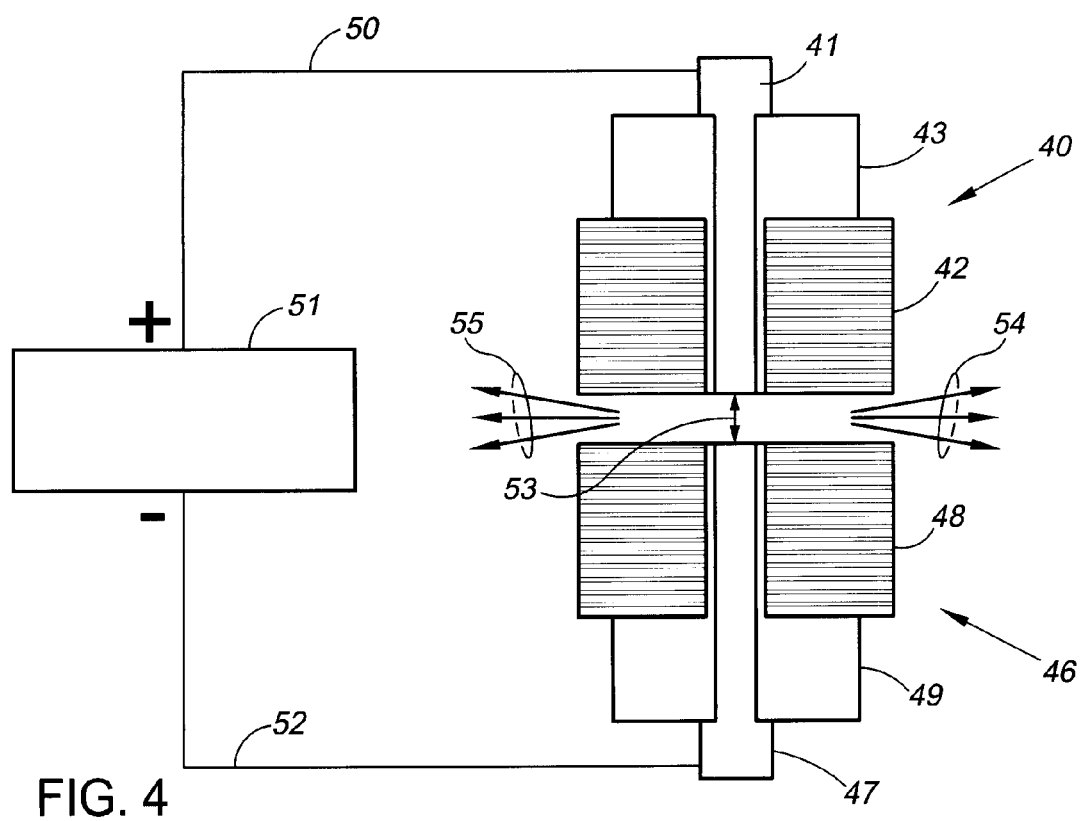
FIG. 4 is a graphic diagram of an alternative embodiment of the present invention wherein the anode and cathode electrodes are placed within an ablative body, but are separated from the ablative electrodes by an insulator.

Referring to FIG. 4, an alternative embodiment of the present invention is illustrated in which a first composite electrode 40 is comprised of a solid anode electrode 41 which is seated within a wider annular ablative body 42. The anode electrode 41 is electrically isolated from the annular ablative body 42 by an annular insulator body 43. Similarly, a second composite electrode 46 is comprised of a solid cathode electrode 47 which is seated within a wider annular ablative body 48. As before, the cathode electrode 47 is electrically isolated from the annular ablative body 48 by an annular insulator body 49.

The anode electrode 41 is connected electrically by way of a conducting wire 50 to the positive terminal of a high power, pulsed power supply 51, the negative terminal of which is electrically connected by way of a conducting wire 52 to the cathode electrode 47. The composite electrodes 40 and 46 are separated by an axial distance 53.

The anode electrode 41, cathode electrode 47, annular ablative body 42, and annular ablative body 48 may be of the same material. The annular ablative bodies 42 and 48 also may be of materials different from that of the anode electrode 41 and the cathode electrode 47, and even may be nonconductors since their purpose is to provide axial physical confinement of the plasma and to be ablated. In the event

TABLE II

COMPARISON BETWEEN PRIOR ART AND RADIAL GUN

|  | RADIAL GUN | AXIAL GUN | TRANSFERRED ARC DISCHARGE |
|---|---|---|---|
| Peak Discharge Power (Watts) | $10^8$ | $10^8$ | $10^5$ |
| Duty Cycle | Pulse | Pulse | Continuous |
| Pulse Length (sec.) | $10^{-3}$ | $10^{-3}$ | Infinite |
| Bore | None | Yes | None |
| Arc Confinement | Physical In Axial Direction, Inertial In Radial Direction | Physical In Radial Direction, Inertial In Axial Direction | None |
| Arc Temperature °K | 50,000 | 50,000 | 10,000 |
| Plasma Quench Mechanism | Supersonic Expansion Into Surrounding Atmosphere | Supersonic Expansion Into Surrounding Atmosphere | Externally Forced Convection |
| Plasma Expansion Between The Electrodes | Primarily Radial | Axial | N/A |
| Electrode Ablation | Both Electrodes | Primarily Muzzle Electrode, Lesser Extent Breech | None. Tungsten Electrode Erosion Is Minimized. Precursor Material is eroded. |
| Inert Gas Electrode Shielding | No | No | Yes |
| Effect Of Electrode Polarity Reversal | Little To No Effect | Little To No Effect | Non-Consumable Electrode Erosion And Nanopowder Contamination. |

The radial gun embodiment of FIG. 3 provides a substantial improvement in cost and efficiency. The high power (megawatt), electric discharge of the radial gun, however, may occur from time to time at other than the center of the electrodes. In this event, the resistance of the arc is the annular ablative bodies 42 and 48 are nonconductors, no annular insulator is required between the ablative bodies and the electrodes.

As illustrated in FIG. 4, the solid anode electrode 41 and the solid cathode electrode 47 have round uniform cross-sections. The electrodes may be composed of metals including, but not limited to, aluminum, copper, or iron. The annular ablative bodies 42 and 48 are hollow, and may be composed of the same materials as the electrodes, as well as nonconductive materials. The annular insulator bodies 43 and 49 respectively electrically isolate the anode electrode 41 and the cathode electrode 47 from the annular ablative bodies 42 and 48.

In operation, the pulsed power supply 51 is energized to cause a high-power, pulsed electrical discharge between the cathode electrode 47 and the anode electrode 41. The discharge arc will attach to the cathode and anode because they are conductors. As the cathode electrode 47 and anode electrode 41 are respectively located in the center of the composite electrodes 46 and 40, which are characterized by diameters that are larger than those of the cathode and anode, the discharge arc can be said to be physically confined to the center of the composite electrodes to a greater extent than provided by the anode and cathode electrodes of the same diameter in the radial gun embodiment of FIG. 3. The construction of the composite electrodes 40 and 46 thus dramatically increase the probability of the discharge arc attaching to the tip areas of both the anode electrode 41 and the cathode electrode 47. The added confinement of the electrical discharge increases its energy to melt, vaporize and ionize material ablated from the anode electrode 41, the cathode electrode 47, and the two annular ablative bodies 42 and 48. Further, the composite electrodes 40 and 46 prevent the axial expansion of the plasma, and the inertial confinement afforded by the pulsed electrical discharge deters expansion of the plasma radially outward as indicated by arrows 54 and 55 of FIG. 4. A high temperature, high density plasma thus is created. The ablation of the anode electrode 41, the cathode electrode 47, and the annular ablative bodies 42 and 48, by the high velocity exit of the plasma radially outward, produces nanopowder at an even higher rate per discharge than that of the invention embodiment illustrated in FIG. 3 above. Further, the ablated material is forced out of the radial gun by the plasma at supersonic speed to be quickly quenched by and/or quickly react with the surrounding gas within the reactor vessel to produce nanopowder.

Although the preferred embodiments of the invention have been disclosed in detail, various substitutions, modifications, and alterations can be made without departing from the spirit and scope of the invention as defined in the Claims.

What is claimed is:

1. An apparatus for synthesizing nanopowders, which comprises:
   an anode electrode and a cathode electrode which are comprised of precursor material, and which are substantially axially aligned but spaced apart within a gaseous atmosphere; and
   a power supply which is in electrical communication with said anode electrode and said cathode electrode, and which effects a high power pulsed electrical discharge to ablate said anode electrode and said cathode electrode to produce said nanopowders.

2. The apparatus of claim 1, wherein said gaseous atmosphere reacts with material ablated from said anode electrode and said cathode electrode to form said nanopowders.

3. The apparatus of claim 1, wherein said gaseous atmosphere quenches material ablated from said anode electrode and said cathode electrode to produce said nanopowders.

4. The apparatus of claim 1, wherein said anode electrode and said cathode electrode are of a same composition.

5. The apparatus of claim 1, wherein said gaseous atmosphere is a mixture of different gases, and said mixture both quenches and reacts with material ablated from said anode electrode and said cathode electrode.

6. The apparatus of claim 1, wherein said gaseous atmosphere is a mixture of different gases, and said mixture quenches material ablated from said anode electrode and said cathode electrode.

7. The apparatus of claim 1, wherein said anode electrode and said cathode electrode have uniform cross-sections.

8. The apparatus of claim 1, wherein said pulsed electrical discharge is sustained by a plasma created from material removed from said anode electrode and said cathode electrode.

9. The apparatus of claim 8, wherein said plasma quenches by means of expansion within said gaseous atmosphere.

10. The apparatus of claim 8 wherein said plasma also reacts with said gaseous atmosphere to produce nanopowder compounds including oxides and nitrides.

11. The apparatus of claim 8, wherein said pulsed electrical discharge occurs in a time period that is short enough to provide inertia confinement of said plasma.

12. The apparatus of claim 8, wherein said gaseous atmosphere is used to control expansion and quench rate of said plasma.

13. The apparatus of claim 8, wherein said anode electrode and said cathode electrode confine said plasma axially, and said pulsed electrical discharge is of a short duration which provides inertial confinement of said plasma.

14. The apparatus of claim 1, wherein said anode electrode and said cathode electrode are composed of one of aluminum, tantalum, titanium, and zirconium.

15. The apparatus of claim 1, wherein said nanopowders are one of alumimium, copper, $Al_2O_3$, $TiO_2$, TiN, ZiN, and $Ta_2N$.

16. The apparatus of claim 1, wherein polarities of said anode electrode and said cathode electrode are reversed.

17. The apparatus of claim 1, wherein said nanopowders are comprised of substantially unagglomerated nanopowder of near uniform size.

18. The apparatus of claim 1, wherein said apparatus provides improved quench and reaction rates which allow production of small sized nanopowder in high volumes while consuming less energy than before realized.

19. The apparatus of claim 1, wherein said anode electrode and said cathode electrode are comprised of high melting point materials.

20. The apparatus of claim 1, wherein said apparatus exhibits cost effectiveness in selection and ablation of materials, and efficiency in consumption of power and production of said nanopowders.

21. The apparatus of claim 1, wherein said anode electrode and said cathode electrode are large diameter rods requiring minimal machining.

22. The apparatus of claim 1, wherein said gaseous atmosphere is at least one of air, oxygen, nitrogen, and helium.

23. The apparatus of claim 1, wherein said anode electrode and said cathode electrode are moved toward each other to maintain production rate of said nanopowders.

24. The apparatus of claim 1, wherein said anode electrode and said cathode electrode are located within a chamber filled with said gaseous atmosphere.

25. An apparatus for synthesizing nanopowders, which comprises:
   a first hollow ablative body composed of a precursor material and having a first outer diameter, and further having a first axial bore of a second diameter;

an anode electrode having a third diameter smaller than said second diameter, and fitted within said first axial bore but electrically isolated from said first hollow ablative body;

a second hollow ablative body composed of said precursor material and having said first diameter, and further having a second axial bore of said second diameter;

a cathode electrode having said third diameter and fitted within said second axial bore but electrically isolated from said second hollow ablative body, and wherein said first hollow ablative body and said second hollow ablative body are substantially axially aligned but spaced apart in a gaseous atmosphere; and a power supply which is in electrical communication with said anode electrode and said cathode electrode, and which effects a high power pulsed electrical discharge to ablate said first hollow ablative body and said second hollow ablative body to produce said nanopowders.

26. The apparatus of claim 25, wherein said gaseous atmosphere consists of one of an inert gas, a reactive gas, and a mixture of inert and reactive gases.

27. The apparatus of claim 25, wherein said gaseous atmosphere is a mixture of inert gases.

28. The apparatus of claim 25, wherein said anode electrode, said cathode electrode, said first hollow ablative body, and said second hollow ablative body are composed of a same material.

29. The apparatus of claim 25, wherein said first hollow ablative body and said second hollow ablative body are composed of a first material, said anode electrode and said cathode electrode are composed of a second material, and said first material is different from said second material.

30. The apparatus of claim 25, wherein said first hollow ablative body and said second hollow ablative body are made of nonconducting material, and are without electrical insulation.

31. The apparatus of claim 25, wherein electrical insulation is provided by a first annular insulator placed between said anode electrode and said first hollow ablative body, and by a second annular insulator placed between said cathode electrode and said second hollow ablative body.

32. The apparatus of claim 25, wherein said first hollow ablative body and said anode electrode form a first composite electrode, said second hollow ablative body and said cathode electrode form a second composite electrode, and said first composite electrode and said second composite electrode radially center said pulsed electrical discharge and substantially prevent axial expansion of a plasma created from ablation of said precursor material.

33. The apparatus of claim 32, wherein said plasma is of a high temperature and high density to accommodate more rapid quenching by and more rapid reaction with said gaseous atmosphere for improved nanopowder production rates.

34. The apparatus of claim 33, wherein said high temperature is of the order of 50,000° K.

35. The apparatus of claim 32, wherein said pulsed electrical discharge is of a duration short enough to inertially confine said plasma.

36. The apparatus of claim 25, wherein said nanopowders are comprised substantially of unagglomerated nanopowder.

37. The apparatus of claim 25, wherein said first hollow ablative body, and said second hollow ablative body, are both one of conductor, semiconductor, and nonconductor.

38. A method of more efficiently synthesizing nanopowder, which comprises the steps of:

forming a gaseous atmosphere;

placing a pair of precursor material electrodes of opposite charge and in axial alignment, but spaced apart, within said gaseous atmosphere;

producing a high power, pulsed electrical discharge between said pair of precursor material electrodes to produce a plasma of high temperature and high density; and quenching said plasma in said gaseous atmosphere to produce said nanopowder.

39. The method of claim 38, wherein said gaseous atmosphere is a mixture of gases for quenching said plasma.

40. The method of claim 38, wherein said high power, pulsed electrical discharge is of a duration short enough to inertially confine said plasma.

41. The method of claim 38, including a step of physically confining said plasma.

42. The method of claim 38, wherein each of said pair of precursor material electrodes is fitted within, but electrically isolated from, one of a pair of ablative annular bodies.

43. The method of claim 38, including the step of applying said gaseous atmosphere to control expansion and quench rates of said plasma.

44. The method of claim 38, including a step of indexing said pair of precursor material electrodes toward each other and repeating the steps of claim 38.

45. The method of claim 38, where the step of quenching occurs in conjunction with a step of reacting said plasma with said gaseous atmosphere.

* * * * *